(12) United States Patent
Putinier (10) Patent No.: US 9,465,088 B2
(45) Date of Patent: Oct. 11, 2016

(54) POLARITY INSENSITIVE HALL EFFECT SENSOR

(71) Applicant: BEI Sensors & Systems Company, Inc., Moorpark, CA (US)

(72) Inventor: Rene Putinier, Oak Park, CA (US)

(73) Assignee: Sensata Technologies, Inc., Attleboro, MA (US)

( * ) Notice: Subject to any disclaimer, the term of this patent is extended or adjusted under 35 U.S.C. 154(b) by 335 days.

(21) Appl. No.: 14/165,954

(22) Filed: Jan. 28, 2014

(65) Prior Publication Data

US 2015/0212165 A1    Jul. 30, 2015

(51) Int. Cl.
| G01B 7/14 | (2006.01) |
| G01B 7/30 | (2006.01) |
| G01R 33/07 | (2006.01) |
| G01D 5/14 | (2006.01) |
| G01B 7/00 | (2006.01) |

(52) U.S. Cl.
CPC ............. *G01R 33/072* (2013.01); *G01B 7/003* (2013.01); *G01D 5/142* (2013.01); *G01B 2210/58* (2013.01)

(58) Field of Classification Search
CPC  G01B 2210/58; G01B 7/003; G01R 33/072; G01D 5/142
USPC .............................. 324/207.2, 251, 691–725
See application file for complete search history.

(56) References Cited

U.S. PATENT DOCUMENTS

| 4,139,880 | A | * | 2/1979 | Ulmer | ................. | H01L 27/0251 |
| | | | | | | 257/E27.062 |
| 5,712,560 | A | * | 1/1998 | Maeda | .................... | G01P 3/487 |
| | | | | | | 324/166 |
| 6,166,451 | A | * | 12/2000 | Pigott | ................... | B60R 21/017 |
| | | | | | | 307/10.1 |
| 7,126,801 | B2 | | 10/2006 | Jokinen | | |
| 7,453,268 | B2 | | 11/2008 | Lin | | |
| 8,120,884 | B2 | * | 2/2012 | Zhang | .................. | H02H 11/003 |
| | | | | | | 361/118 |
| 2002/0060889 | A1 | * | 5/2002 | Teutsch | ............... | H01L 27/0255 |
| | | | | | | 361/23 |
| 2004/0052022 | A1 | | 3/2004 | Laraia | | |
| 2011/0195744 | A1 | | 8/2011 | Zhang | | |

FOREIGN PATENT DOCUMENTS

JP    02148955    6/1990

OTHER PUBLICATIONS www.honeywell.com/sensing; "Rotary Position Sensor Line Guide", 12 pages; retrieved from Internet—Dec. 16, 2013.

* cited by examiner

*Primary Examiner* — Jay Patidar
(74) *Attorney, Agent, or Firm* — Banner & Witcoff, Ltd.

(57) ABSTRACT

Non-contact positions sensors are desirable because they have lower failure rates than traditional potentiometers. However, using a Hall Effect sensor as a non-contact position sensor requires a particular input polarity. In an embodiment, a polarity insensitive Hall Effect sensor includes conversion sensors configured to produce outputs responsive to an input. The sensor also includes a semiconductor rectifier arranged to power a first conversion sensor and a second conversion sensor with a given polarity regardless of whether the input has a positive or negative polarity. The sensor also includes a semiconductor multiplexer circuit arranged to direct the first output to a common output port if the input has a positive polarity and direct the second output to the common output port if the input has a negative polarity. The polarity insensitive Hall Effect sensor provides an output representing a position without requiring a input polarity.

20 Claims, 8 Drawing Sheets

POLARITY INSENSITIVE HALL EFFECT SENSOR

BACKGROUND OF THE INVENTION

Potentiometers have a physical contact that rides on a resistive element. The physical contact of the potentiometer is a point of failure for the potentiometer. This point of failure decreases the reliability of potentiometers in relation to non-contacting sensors, such as a Hall Effect sensor. Non-contacting sensors, such as Hall Effect sensors, can replace potentiometers in many applications.

SUMMARY OF THE INVENTION

In an embodiment, a linear or rotation sensor includes a first conversion sensor configured to produce a first output responsive to a given input. The sensor further includes a second conversion sensor configured to produce a second output responsive to the given input. The sum of the first output and second outputs is constant regardless of whether the given input has a positive or negative polarity. The sensor also includes a semiconductor rectifier arranged to power the first conversion sensor and the second conversion sensor with a given polarity regardless of whether the given input has a positive or negative polarity. The sensor also includes a semiconductor multiplexer circuit arranged to direct the first output to a common output port if the given input has a positive polarity and direct the second output to the common output port if the given input has a negative polarity.

In an embodiment, the first conversion sensor is a hall effect sensor and the second conversion sensor is a hall effect sensor.

In an embodiment, the semiconductor multiplexer can include a first channel to direct the first output to the common output port. The first channel includes a first set of n-type MOSFET semiconductors connected in series and a second set of p-type MOSFET semiconductors connected in series. The first set and the second set are connected in parallel. The semiconductor multiplexer includes a second channel to direct the second output to the common output port. The second channel includes a third set of n-type MOSFET semiconductors connected in series and a fourth set of p-type MOSFET semiconductors connected in series. The third set and the fourth set are connected in parallel.

In an embodiment, respective sources of the MOSFETs within the respective first, second, third, and fourth sets of semiconductors are directly connected. The respective gates of the MOSFETs of the first, second, third, and fourth sets of semiconductors are directly connected. A first of the drains of the first set and a first of the drains of the second set are coupled to receive the first output. The gates of the first set and the fourth set are coupled to a first input port receiving a first signal defining a first portion of the given input. The gates of the second set and the third set are coupled to a second input port receiving a second signal defining a second portion of the given input. The first and second signals, when measured relative to each other at the same time instants, determine the polarity of the given input signal. A first of the drains of the third set and a first of the drains of the fourth set are coupled to receive the second output. A second of the drains of the first set, a second of the drains of the second set, a second of the drains of the third set, and a second of the drains of the fourth set are coupled to the common output port.

In an embodiment, the semiconductor rectifier includes at least four MOSFETs. Each MOSFET has a respective source, drain, and gate. A first of the MOSFETs is coupled (i) at its drain to a first port of the given input and a drain of a second of the MOSFETs, (ii) at its gate to a second port of the given input, and (iii) at its source to a the source of third of the MOSFETs and the first and second conversion sensors. The second of the MOSFETs is coupled (i) at its drain to the first port of the given input and the drain of the first of the MOSFETs, (iii) at its gate to a second port of the given input, and (iii) at its source the source of to a fourth of the MOSFETs and the first and second conversion sensors. The third of the MOSFETs is coupled (i) at its source to the source of the first of the MOSFETs, and the first and second conversion sensors, (ii) at its drain to the second port of the given input, and (iii) at its gate to the first port if the given input. The fourth of the MOSFETs is coupled (i) at its drain to the second port of the given input and the drain of the third of the MOSFETs, (ii) at its gate to the first port of the given input, and (iii) at its source to the source of the second MOSFETs and the first and second conversion sensors.

In an embodiment, the semiconductor rectifier is configured to direct a signal of a correct polarity to the first conversion sensor and the second conversion sensor based on the polarity of the given input. The semiconductor multiplexer, based on the polarity of the same given input, is configured to direct the first output or the second output to the common output port.

In an embodiment, the sensor also includes a programming module including three ports through which to program the first and second conversion sensors. The first and second programming module ports are coupled to the semiconductor rectifier to power the first and second conversion sensors during application of positive and negative polarity voltage levels, respectively. The third programming module port is coupled to the common output to program the first and second conversion sensors during application of the positive and negative polarity voltage levels, respectively, to the first and second conversion sensors.

In an embodiment, the first and second conversion sensors are configured to measure a rotation or linear position of a mechanical device being observed regardless of the polarity of the given input.

In an embodiment, a method of sensing linear position or rotation includes producing a first output responsive to a given input at a first conversion sensor. The method further includes producing a second output responsive to the given input at a second conversion sensor. The sum of the first output and second outputs is constant regardless of whether the given input has positive or negative polarity. The method further includes powering, at a semiconductor rectifier, the first conversion sensor and the second conversion sensor with a given polarity regardless of whether the given input has a positive or negative polarity. The method also includes directing, at a semiconductor multiplexer circuit, the first output to a common output port if the given input has a positive polarity and the second output to the common output port if the given input has a negative polarity.

In an embodiment, an apparatus for linear or rotation sensor includes a first conversion sensor means for producing a first output responsive to a given input. The apparatus further includes a second conversion sensor means for producing a second output responsive to the given input. The sum of the first output and second output is constant regardless of whether the given input has a positive or negative polarity. The apparatus further includes a semiconductor rectifier means for powering the first conversion sensor and the second conversion with a given polarity regardless of whether the given input has a positive or negative polarity. The apparatus also includes a semiconductor multiplexer means for directing the first output to a common output port if the given input has a positive polarity and direct the second output to the common output port if the given input has a negative polarity.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of example embodiments of the invention follows.

Figure 1:
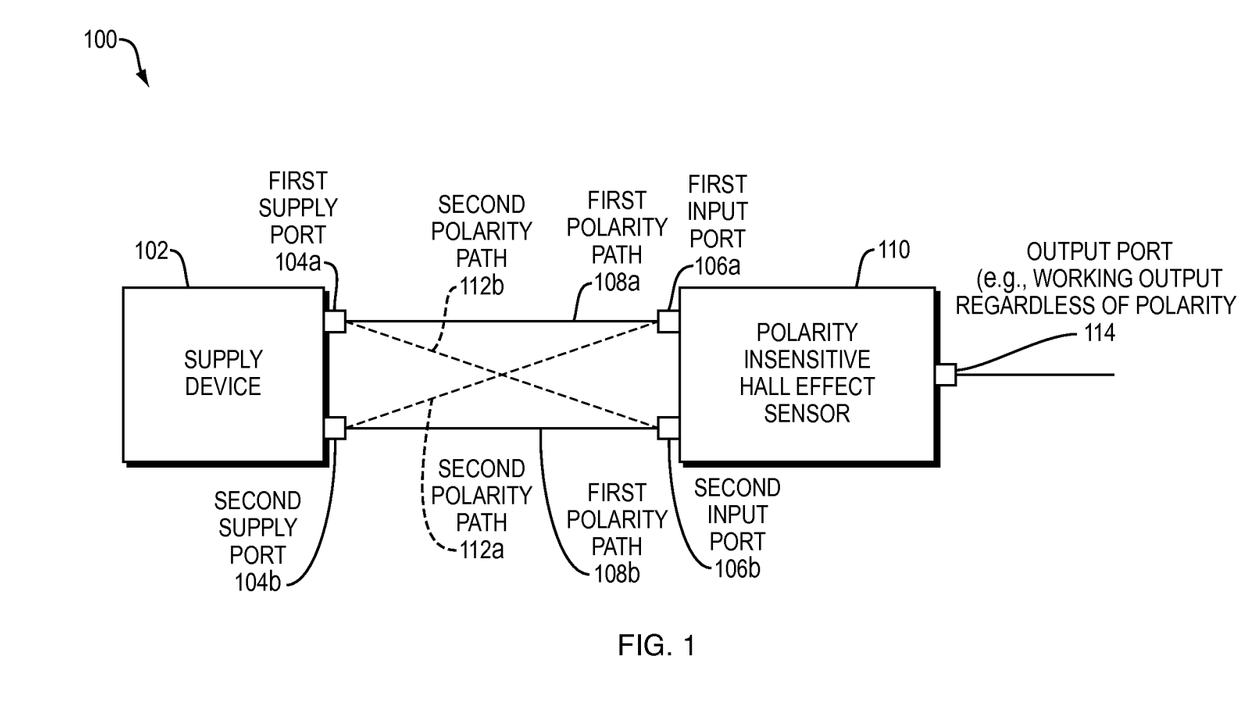
FIG. 1 is a block diagram illustrating an example embodiment of a polarity insensitive Hall Effect sensor employed by the present invention.

FIG. 1 is a block diagram 100 illustrating an example embodiment of a polarity insensitive Hall Effect sensor 110 employed by the present invention. The polarity insensitive Hall Effect sensor 110 includes a first input port 106a and second input port 106b, which can be connected to a first supply port 104a and second supply port 104b of a supply device 102, or other input device. The polarity insensitive hall effect sensor 110 is configured to receive input from the supply device 102 in any polarity. For example, when the first supply port 104a is coupled with the first input port 106a and the second supply port 104b is coupled with the second input port 106b, the supply device 102 provides a first polarity path 108a-b to the polarity insensitive Hall Effect sensor 110. On the other hand, if the first supply port 104a is coupled with the second input port 106b and the second supply port 104b is coupled with the first input port 106a, the supply device 102 provides a second polarity path 112a-b to the polarity insensitive Hall Effect Sensor 110. Reversing the connections of the input ports 106a-b to the supply ports 104a-b reverses the polarity of the polarity paths 108a-b and 112a-b. For example, if the first polarity path 108a-b provides a voltage difference of 5V, reversing the connections reverses the polarity in the second polarity path 112a-b, making it negative 5V. Regardless of the polarity, the polarity insensitive Hall Effect sensor 110 outputs, at its output port 114. Like a traditional potentiometer, reversing the polarity of the input can reverse the output. For example, a potentiometer which has an output range of 0-5V and outputs 4V for the position of its rotor for one polarity outputs 1V for the same position of the rotor for a reverse polarity. The polarity insensitive Hall Effect sensor 110 performs the same way.

Figure 2:
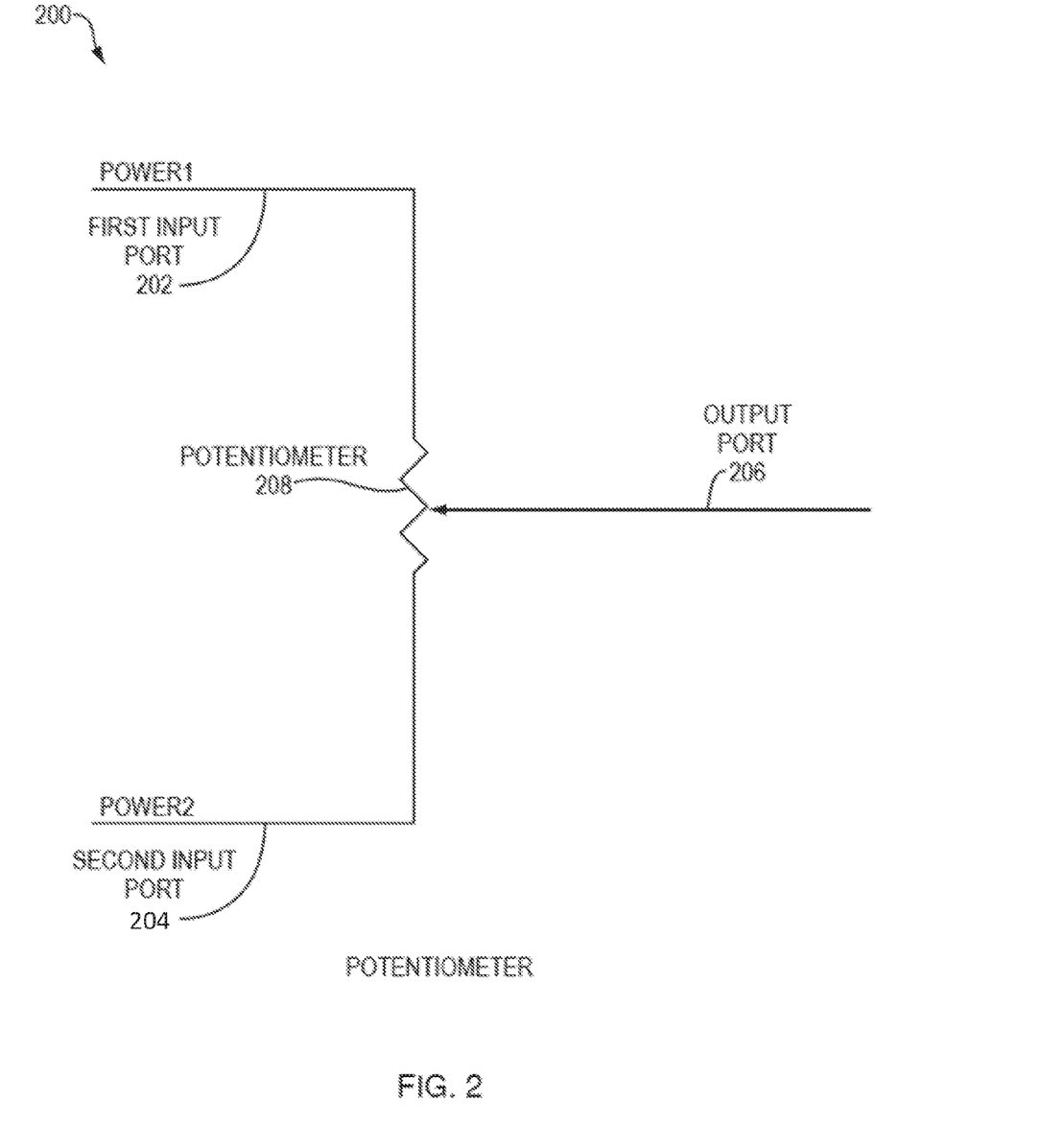
FIG. 2 is a block diagram illustrating an example embodiment of a traditional potentiometer.

FIG. 2 is a block diagram 200 illustrating an example embodiment of a traditional potentiometer 208. The potentiometer is connected to a first input port 202 (POWER1) and a second input port 204 (POWER2). The potentiometer 208 also has an output port 206. The potentiometer 208, based on a position of a rotor, outputs a voltage proportional to the position of the rotor between the voltage difference of the first input port 202 and second input port 204. Some applications use potentiometers 208 as a ratiometric device (e.g., a device that produces an output proportional to its input). Inputs of power (e.g., first input port 202) and ground (e.g., second input port 204) are applied to the potentiometer 208 element. The potentiometer 208 element outputs a voltage on a wiper output (e.g., the output port 206) that varies between power (e.g., first input port 202) and ground (e.g., second input port 204) as the rotor is turned. In a traditional potentiometer 208, power and ground can be applied to either end of the device because the potentiometer is a resistor, such that the first input port 202 can be either a power or a ground and the second input port 204 can be either a power of a ground.

Figure 3:
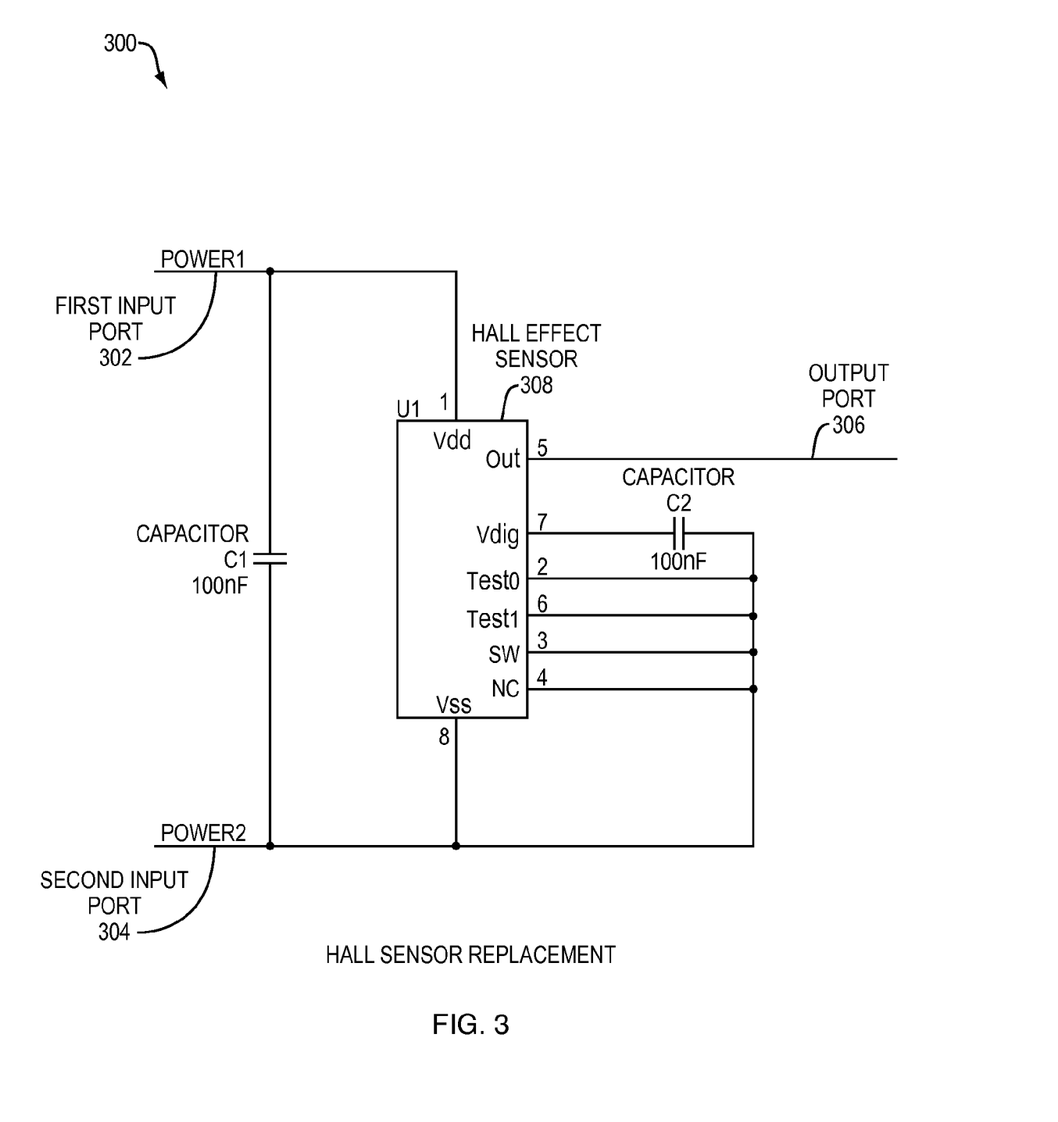
FIG. 3 is a block diagram of an embodiment of a Hall Effect sensor employed to emulate a potentiometer.

FIG. 3 is a block diagram 300 of an embodiment of a Hall Effect sensor 308 employed to emulate a potentiometer. Unlike the resistance based potentiometer of FIG. 2, a Hall Effect sensor 308 of FIG. 3 is an active semiconductor device and needs to have power and ground applied to specific ports. In the embodiment shown in FIG. 3, the Hall Effect sensor 308 has the first input port 302 (POWER1), which is the power supply, connected to port 1 ($V_{dd}$) and has the second input port 304 (POWER2), which is the ground, connected to port 8 ($V_{ss}$). The Hall Effect sensor 308 cannot swap the power and ground (e.g., applying power to port 8 ($V_{ss}$) and applying ground to port 1 ($V_{dd}$)), however, such a swap can be performed on a traditional resistor based potentiometer, such as the potentiometer 208 of FIG. 3.

Figure 4:
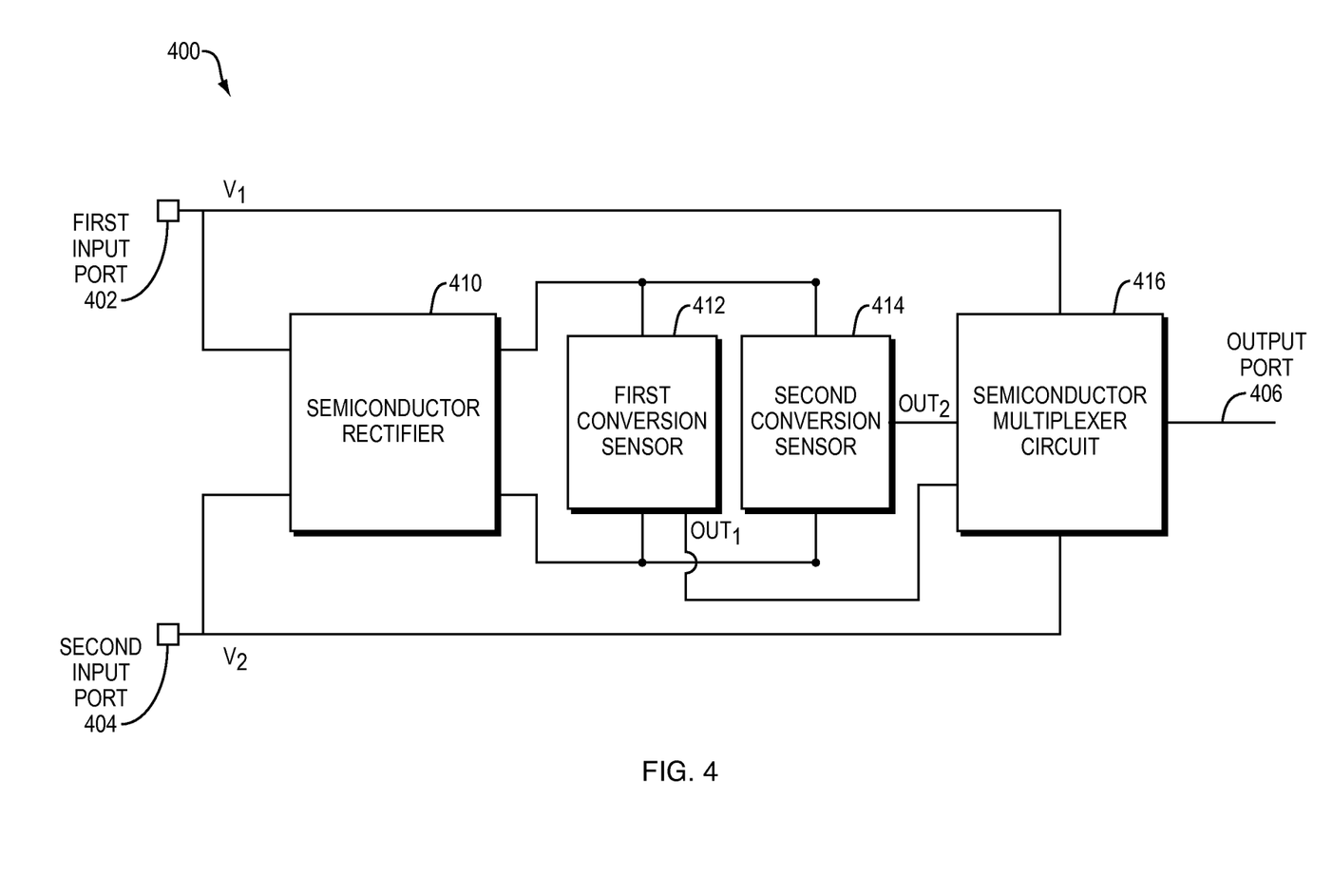
FIG. 4 is a high level block diagram illustrating an example embodiment of the present invention.

FIG. 4 is a high level block diagram 400 illustrating an example embodiment of the present invention. In an embodiment, the present invention is a polarity insensitive Hall Effect sensor which includes additional circuitry that allows power and ground to be applied in any polarity. In addition, it also changes the output voltage to mimic the output of a potentiometer. For example, suppose a user applied a 5V difference to a potentiometer which, based on the position of the rotor, output 4V. If the user then reversed the power and ground inputs to the potentiometer, the potentiometer would then output 1V (e.g., the inverse of the output with the reverse polarity based on the power scale, or 5V−4V). The polarity insensitive Hall Effect sensor modifies the output voltage to match this behavior. The present invention further provides protection for the Hall Effect Sensor against reverse polarity. Hall Effect sensors can be damaged by applying negative voltage to the power pins. The present invention provides current paths that prevent the Hall Effect sensor itself from receiving a negative voltage.

A semiconductor rectifier 410 is coupled to a first input port 402 and a second input port 404, receiving voltages of $V_1$ and $V_2$, respectively. The semiconductor rectifier 410 is coupled to output to a first conversion sensor 412 and second conversion sensor 414, which can both be Hall Effect sensors, or other polarity sensitive sensors. The semiconductor rectifier 410 is configured to output a positive polarity to both the first conversion sensor 412 and second conversion sensor 414, regardless of the polarity of the first input port 402 and second input port 404. In other words, the semiconductor rectifier provides a voltage difference of $|V_1-V_2|$ to both the first conversion sensor 412 and second conversion sensor 414. Therefore, the first conversion sensor 412 and second conversion sensor 414 can output respective working signals, being $Out_1$ and $Out_2$, respectively, to a semiconductor multiplexer circuit 416. The semiconductor multiplexer circuit 416 is configured to determine the polarity of the first input port 402 and second input port 404 (e.g., $|V_1-V_2|$) and output either $Out_1$ or $Out_2$ at the output port 406 based on the determined polarity.

Therefore, the polarity insensitive Hall Effect sensor can receive a positive or negative power on either its first input port 402 or second input port 404. An individual Hall Effect sensor, such as the Hall Effect sensor 308 shown in FIG. 3, can only receive positive power on its POWER1 lead and $V_{dd}$ port and negative power (or ground) on its POWER2 lead and $V_{ss}$ port. In the Hall Effect sensor of FIG. 3, if the voltage placed on POWER2 is positive relative to POWER1 (e.g., POWER2>POWER 1), the Hall Effect Sensor 308 sensor does not operate. In addition, if the voltage is more than a particular amount, such as 10V, certain Hall Effect sensors can be damaged. The polarity insensitive Hall Effect sensor employed in an embodiment of the present invention solves this problem by conditioning the input signals and output signals. The polarity insensitive Hall Effect sensor, like a traditional potentiometer, has two input power leads and a single output lead to the outside world.

Figure 5:
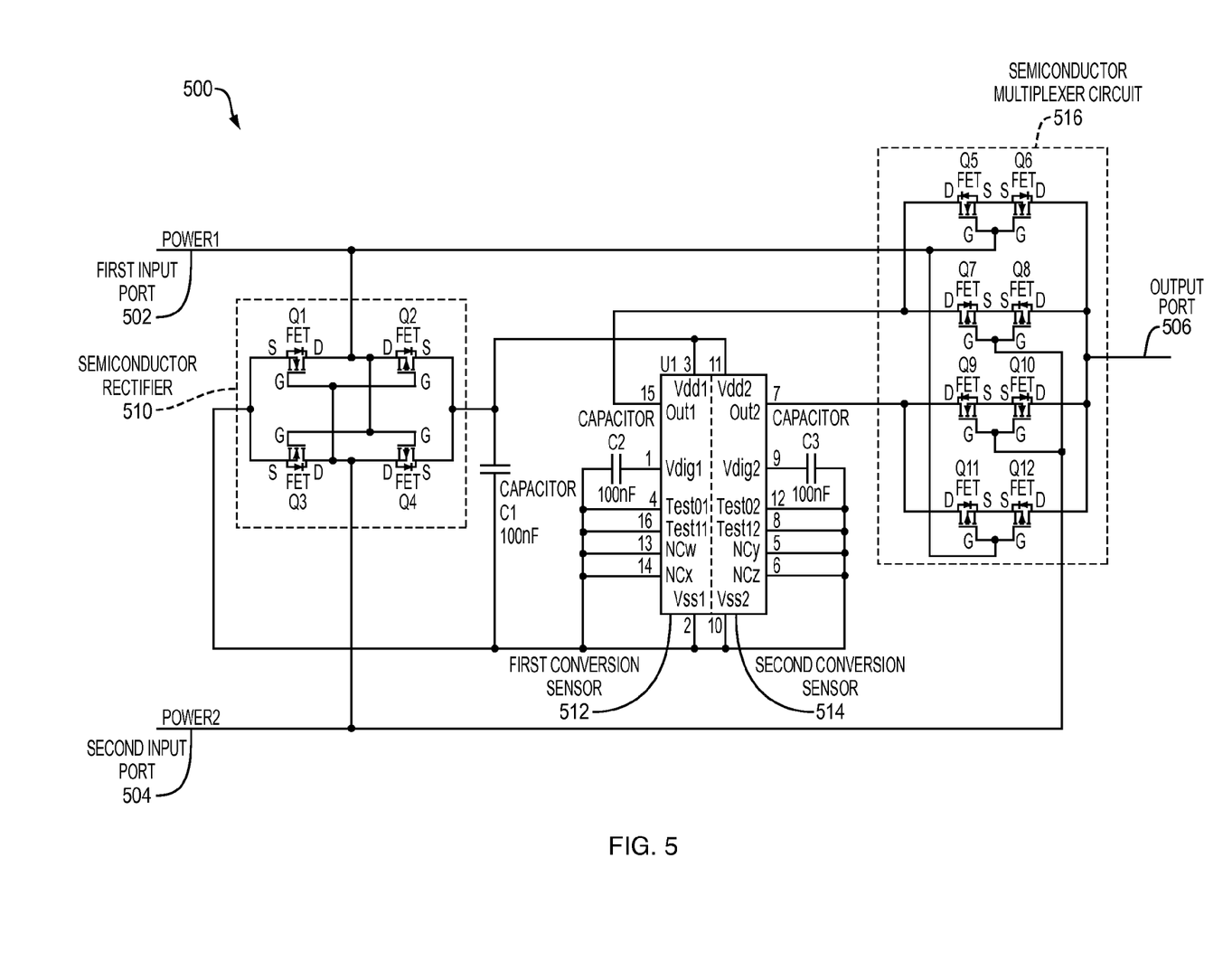
FIG. 5 is a block diagram illustrating an example embodiment of the polarity insensitive Hall Effect sensor employed in an embodiment of the present invention.

FIG. 5 is a block diagram 500 illustrating an example embodiment of the polarity insensitive Hall Effect sensor employed in an embodiment of the present invention. The polarity insensitive Hall Effect sensor employs a semiconductor rectifier 510, first conversion sensor 512, second conversion sensor 514, and semiconductor multiplexer circuit 516, corresponding to the semiconductor rectifier 410, first conversion sensor 412, second conversion sensor 414, and semiconductor multiplexer circuit 416 of FIG. 4. The polarity insensitive Hall Effect sensor receives input from a first input port 502 (POWER1), second input port 504 (POWER2), corresponding to the first input port 402 and second input port 404, respectively, of FIG. 4. The polarity insensitive Hall Effect sensor outputs at an output port 506, corresponding to the output port 406 of FIG. 4.

In reference to FIG. 5, MOSFET transistor elements Q1-Q12 are shown. Each MOSFET transistor has a respective source, drain, and gate, which are indicated in FIG. 5 by the designations "S" for source, "D" for drain, and "G" for gate, respectively. The configuration of FIG. 5 shows an example embodiment of the semiconductor rectifier 510 and semiconductor multiplexer circuit 516 coupled with the first and second conversion sensors 512 and 514, but other arrangements of semiconductor elements such as the MOSFET transistor elements can be employed. An example MOSFET that can be used is the International Rectifier IRF7343 HEXFET® Power MOSFET, the details of which are available at http://www.irf.com/product-info/datasheets/data/irf7343.pdf, which is hereby incorporated by reference in its entirety. The IRF7343 houses one p-channel MOSFET and one n-channel MOSFET, however, other MOSFETs can be used.

MOSFET transistor elements Q1, Q2, Q3 and Q4 rectify the POWER1 and POWER2 signals. In an embodiment, Q1 and Q3 are N-channel MOSFETs and Q2 and Q4 are P-channel MOSFETs. The semiconductor rectifier 510 is coupled to provide a correct polarity to the first conversion sensor 512 and second conversion sensor 514 at their $V_{dd1}$ and $V_{ss1}$ and $V_{dd2}$ and $V_{ss2}$ ports, respectively. A capacitor C1 maintains a voltage difference between the two outputs of the semiconductor rectifier 510. Capacitors C2 and C3 further maintain a voltage difference between one of the outputs of the semiconductor rectifiers and the first conversion sensor 512 and second conversion sensor 514.

The first conversion sensor 512 provides an output to the semiconductor multiplexer circuit 516 and the second conversion sensor 514 provides an output to the semiconductor multiplexer circuit 516. The semiconductor multiplexer circuit 516 also accepts POWER1 and POWER2 as inputs. Based on the relationship of POWER1 and POWER2, the semiconductor multiplexer circuit 516 outputs either the output of the first conversion sensor 512 or the output of the second multiplexer circuit 516 at the output port 506.

Figure 6A:
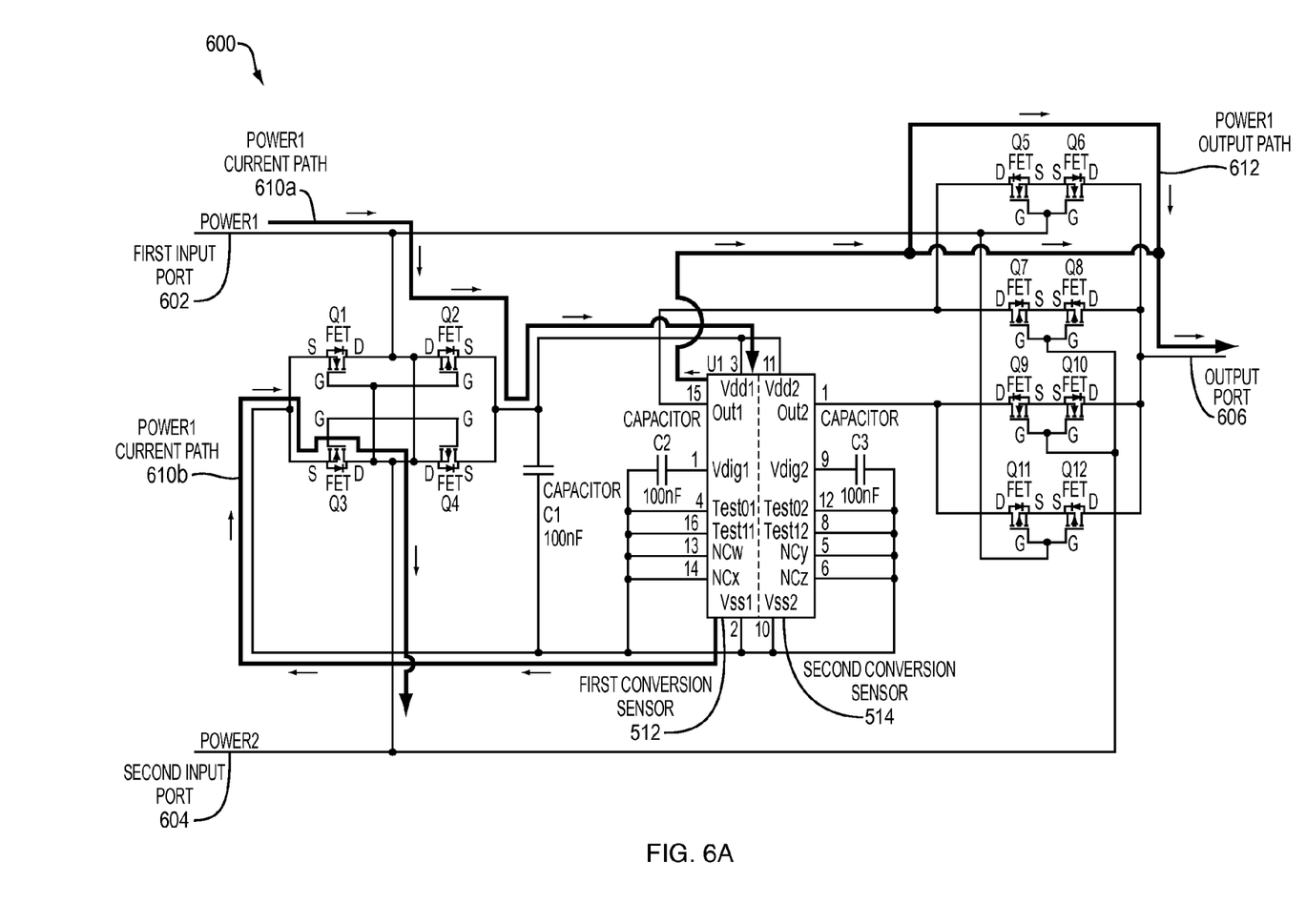
FIG. 6A is a block diagram illustrating an example embodiment of current paths in the polarity insensitive Hall Effect sensor in a first polarity.

FIG. 6A is a block diagram 600 illustrating an example embodiment of current paths in the polarity insensitive Hall Effect sensor in a first polarity. If the voltage of POWER1 is greater than POWER2 (POWER1>POWER2), Q2 and Q3 turn on and conduct, and Q1 and Q4 turn off and do not conduct. POWER1 Current Path 610a-b therefore conducts through Q2 to $V_{dd1}$ of the first conversion sensor 512. The POWER1 current path 610b continues at $V_{ss1}$ of the first conversion sensor 512, conducting through Q3 to the second input port 604. The POWER1 current path 610a also conducts to $V_{dd2}$ of the second conversion sensor 514. The POWER1 current path 610b also continues at $V_{ss2}$ of the second conversion sensor 514, conducting through Q3 to the second input port 604.

Figure 6B:
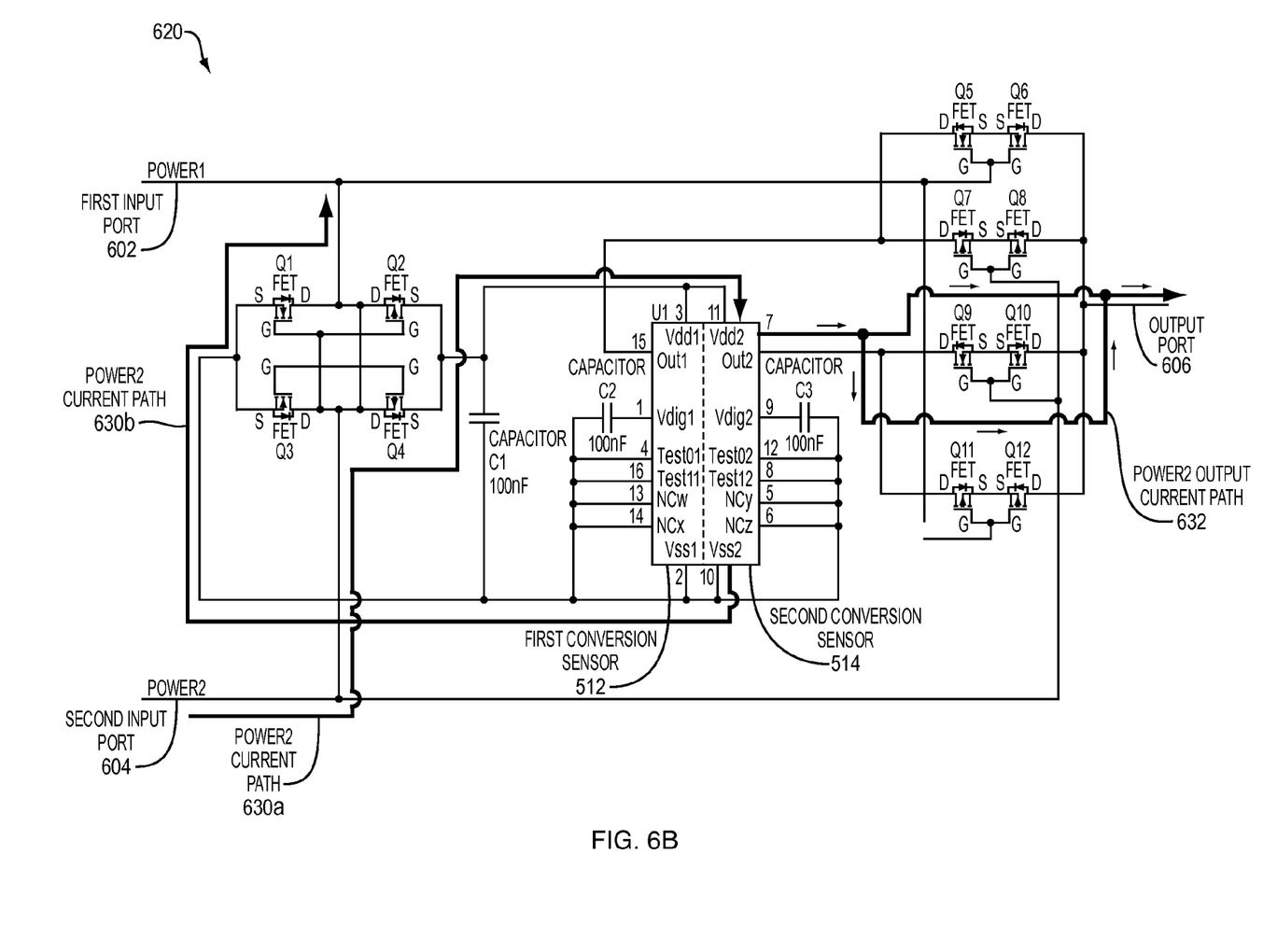
FIG. 6B is a block diagram illustrating an example embodiment of current paths in the polarity insensitive Hall Effect sensor in a second polarity.

FIG. 6B is a block diagram 620 illustrating an example embodiment of current paths in the polarity insensitive Hall Effect sensor in a second polarity. If POWER2 is greater than POWER1 (POWER1<POWER2), Q1 and Q4 turn on and conduct and Q2 and Q3 turn off and do not conduct. The POWER2 current path 630b therefore conducts from POWER2 through Q4 to $V_{dd2}$ of the second conversion sensor 514. The POWER2 current path 630b also continues at $V_{ss2}$ of the second conversion sensor 514, conducting through Q1 to the first input port 602. The POWER2 current path 630a also conducts to $V_{dd1}$ of the first conversion sensor 512. The POWER2 current path 630b also continues at $V_{ss1}$ of the first conversion sensor 512, conducting through Q1 to the first input port 602.

Q1, Q2, Q3, and Q4 are selected so that the sum of gate threshold voltages of the N and P channel MOSFETs is less than the applied voltage. The Q1, Q2, Q3, and Q4 MOSFETs of the semiconductor rectifier 510 route the positive voltage applied to the $V_{dd1}$ and $V_{dd2}$ pins of the first conversion sensor 512 and second conversion sensor 514 (e.g., Hall Effect sensors), respectively. The Q1, Q2, Q3, and Q4 MOSFETs of the semiconductor rectifier 510 route the negative voltage to the $V_{ss1}$ and $V_{ss2}$ pins of the first conversion sensor 512 and second conversion sensor 514, respectively.

The first conversion sensor 512 outputs a signal at Out1 (Port 15) as Power1 Output Path 612 and the second conversion sensor 514 outputs a signal at Out2 (port 7) as Power2 Output Path 632. The semiconductor multiplexer circuit 516 (e.g., a switch matrix) routes one of the two outputs, Out1 and Out2 of the first conversion sensor 512 and second conversion sensor 514, respectively, to the output port 606. The semiconductor multiplexer circuit 516 is comprised of MOSFETs Q5, Q6, Q7, Q8, Q9, Q10, Q11 and Q12. In an embodiment, the MOSFETs Q5-Q12 are MOSFET pair IRF7343 devices, however other MOSFETs can be used. When positive voltage is applied to POWER1 and relative negative power to POWER2, Q5, Q6, Q7, and Q8 (a first channel) are turned on while Q9, Q10, Q11 and Q12 (a second channel) are in cutoff. The current runs through Q5, Q6, Q7, and Q8 (the first channel) to output port 606 along Power1 Output Path 612. Even though both the first conversion sensor 512 and second conversion sensor 514 are powered by the POWER1 current path 610b, only Out1 of the first conversion sensor 512 is outputted at the output port 606.

When a positive voltage is applied to POWER2 relative to POWER1, MOSFETs Q9, Q10, Q11 and Q12 (the second channel) are turned on and Q5, Q6, Q7 and Q8 (the first channel) are turned off/in cutoff. The current runs through Q9, Q10, Q11 and Q12 (the second channel) to output port 606 along Power2 Output Path 632. Even though both the first conversion sensor 512 and second conversion sensor 514 are powered by the POWER2 current path 630a, only Out2 of the second conversion sensor 514 is outputted at the output port 606.

A person of ordinary skill in the art can recognize that regardless of the polarity of POWER1 and POWER2, that POWER1 current path 610a-b and POWER2 current path 630a-b flow through $V_{dd1}$, $V_{ss1}$ and $V_{dd2}$, $V_{ss2}$ simultaneously, respectively. However, FIGS. 6A-B show the current paths powering the respective conversion sensor that is outputting to the output port 606 to clearly show the role of the semiconductor rectifier and semiconductor multiplexer, even though both conversion sensors are simultaneously powered.

Pairs of MOSFETs Q5 and Q6, Q7 and Q8, (the first channel) Q9 and Q10, and Q11 and Q12 (the second channel) are coupled at each pair's respective MOSFET source port such that the body diode of the opposing channel MOSFET does not conduct current. Further, each channel needs a set of N-channel MOSFETs and a set of P-channel MOSFETs because neither an N-channel MOSFET nor a P-channel MOSFET alone can conduct over the full range of output voltages for the polarity insensitive Hall Effect sensor. For example, when POWER1 is positive (e.g., 5V) relative to POWER2, the gates of Q5 and Q6 are at 5V, and Q5 and Q6 are turned on for output voltages from 0 to about 4V. Above 4V, there is no longer sufficient gate-source voltage to keep the MOSFET on. Likewise, P-channel MOSFETs Q7 and Q8 are turned on when the output voltage is between 1V and 5V, but for voltages below 1V, there is insufficient gate-source voltage to keep them on. For much of the range, both the N-channel and P-channel MOSFETs pairs are active but at the extremes of the range, only one or the other is turned on. Likewise, the combined output at the Output Port 606 is the combination of the current through MOSFET pairs Q5 and Q6 and Q7 and Q8. Although the output impedance varies, typical current draw in most applications is small, so the voltage drop in the semiconductor multiplex has a minimal variance in the voltage drop.

The resistance at saturation (Rds) of the MOSFETS determines the voltage drop through the MOSFETs. One example MOSFET that can be used is the IRF7343, which has 50 mΩ and 105 mΩ Rds for the N- and P-channel MOSFETs, respectively. These Hall Effect sensors consume current of approximately 16 milliamps (mA), which causes a voltage drop through the MOSFETS of about 2.48 mV. The voltage applied powers two Hall Effect sensors, for example an MLX90316, which houses two separate Hall Effect sensor dies in one package.

Figure 7:
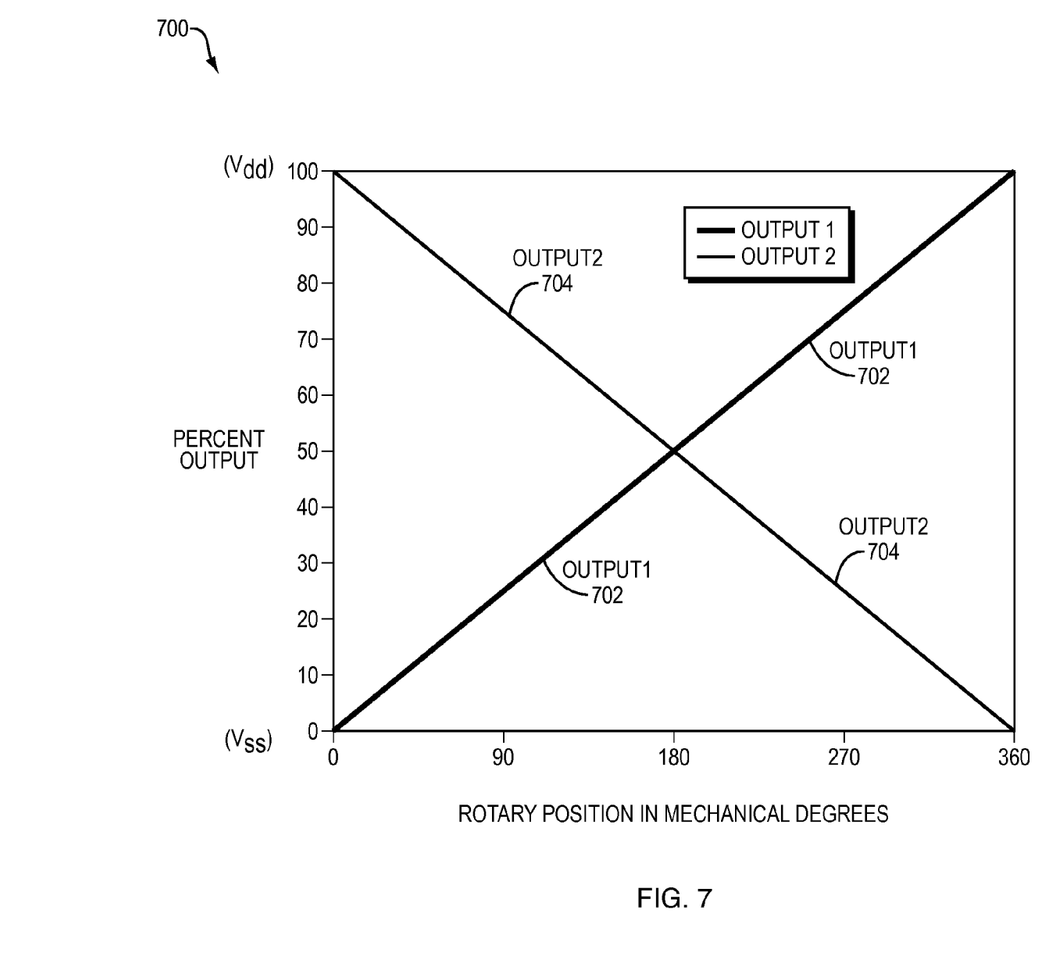
FIG. 7 is a graph illustrating an example embodiment of percentage output of the polarity insensitive Hall Effect sensor as a function of a rotary position of a rotor in degrees.

FIG. 7 is a graph 700 illustrating an example embodiment of percentage output of the polarity insensitive Hall Effect sensor as a function of a rotary position of a rotor in degrees. The polarity insensitive Hall Effect sensor has two output curves, Output1 702 and Output2 704, representing a respective polarity of the input signal. When the voltage polarity is switched, the output polarity of the Hall Effect sensor is inversed to mimic the output of a traditional potentiometer. When the wiper of a potentiometer is offset from center and the polarity of the input voltage is reversed, the output voltage follows the input. When the input switches polarity, the semiconductor multiplexer circuit, or output multiplexer, switches from the output of one Hall Effect sensor to the other Hall Effect Sensor.

Potentiometers and their Hall Effect sensor equivalents can change their output linearly as the rotational position they are detecting changes. Output1 702 shows the output of the polarity insensitive Hall Effect sensor in a first polarity. Output2 704, the complimentary output to Output1 702, should therefore an increase in voltage from the negative supply that is the same as the voltage decrease that Output1 702 has from the positive supply. For example, if the input shaft of the hall sensor is at 90°, Output1 702 produces a signal representing 25% of the positive supply, and Output2 704 produces a signal representing 75% of the positive supply, or 25% away from the negative supply.

In an embodiment, the invention also solves a problem created when using the two Hall Effect sensors. Each Hall Effect sensor is programmed, for example by a Melexis PTC-04 programming box. Programming a Hall Effect sensor is performed by connecting to three wires of the sensor. However, two Hall Effect sensors share the three wires. The circuit of the present invention solves this problem. To program the first hall sensor, the three programming wires are connected to the polarity insensitive Hall Effect Sensor. To program the second sensor, the power and ground wires are reversed and a second sensor can then be programmed. The programming box can access only one of the two sensors at a time because the switching elements behave different depending on how power is applied. The polarity insensitive Hall Effect sensor allows power reversal and therefore provides a way of programming two Hall sensors through a single wire interface.

Other structures of the polarity insensitive Hall Effect circuit can be designed by a variety of electrical devices and connections.

"Polarity protection implemented with a MOSFET" by Jokinen, U.S. Pat. No. 7,126,801 (hereinafter "Jokinen") shows an N-channel MOSFET in series with a negative lead to disconnect in case of reverse polarity. "Input Power Protected Ratiometric Output Sensor Circuit" by Lin, U.S. Pat. No. 7,453,268 shows a system for a ratiometric sensor using both high side and low side MOSFET switches. "Reverse Voltage Protection Circuit" by Zhang, U.S. Pub. No. 2011/0195744 (hereinafter "Zhang") and "Integrated overvoltage and reverse voltage protection circuit" by Laraia, U.S. Pub. No. 2004/0052022 (hereinafter "Laraia") show similar methods. However, Jokinen, Lin, Zhang and Laraia do not suggest operation while reverse voltage is applied.

"Polarity Detection Circuit" by Terasaki, Japanese Pat. No. JP02148955 (hereinafter "Terasaki") shows a system for detecting reverse polarity, but employs a diode bridge for rectification, which results in an undesirable high voltage drop across the diode bridge. The present invention avoids such a voltage drop.

The above patents and patent applications are hereby incorporated by reference in their entirety.

In another embodiment, instead of using two separate Hall Effect sensors, the polarity insensitive Hall Effect sensor can couple an amplifier to a single Hall Effect sensor to provide an inversed output graph with a negative transformation (e.g., the relationship of $V_{out}=V_{supply}-V_{in}$ when polarity is reversed). Using only one Hall Effect sensor reduces cost and requires programming of only one Hall Effect sensor. However, the output when the polarity is reversed may have a larger error because the amplifier's error is added to the Hall Effect error. When using two Hall Effect sensors, only one sensor is active at a time so only the error from one sensor is present.

Other elements could be used as substitutes for the MOSFET transistors (e.g., relays or other devices) as long as they have high off state resistance and low voltage drop in the on state.

The teachings of all patents, published applications and references cited herein are incorporated by reference in their entirety.

While this invention has been particularly shown and described with references to example embodiments thereof, it will be understood by those skilled in the art that various changes in form and details may be made therein without departing from the scope of the invention encompassed by the appended claims.

What is claimed is:

1. A linear or rotation sensor, comprising:
   a first conversion sensor configured to produce a first output responsive to a given input;
   a second conversion sensor configured to produce a second output responsive to the given input, a sum of the first output and second outputs being constant regardless of whether the given input has a positive or negative polarity;
   a semiconductor rectifier arranged to power the first conversion sensor and the second conversion sensor with a given polarity regardless of whether the given input has a positive or negative polarity; and
   a semiconductor multiplexer circuit arranged to direct the first output to a common output port if the given input has a positive polarity and direct the second output to the common output port if the given input has a negative polarity.

2. The sensor of claim 1, wherein the first conversion sensor is a hall effect sensor and the second conversion sensor is a hall effect sensor.

3. The sensor of claim 1, wherein the semiconductor multiplexer includes:
   a first channel to direct the first output to the common output port, the first channel including a first set of n-type MOSFET semiconductors connected in series and a second set of p-type MOSFET semiconductors connected in series, the first set and the second set connected in parallel; and
   a second channel to direct the second output to the common output port, the second channel including a third set of n-type MOSFET semiconductors connected in series and a fourth set of p-type MOSFET semiconductors connected in series, the third set and the fourth set connected in parallel.

4. The sensor of claim 3, wherein
respective sources of the MOSFETs within the respective first, second, third, and fourth sets of semiconductors are directly connected, respective gates of the MOSFETs of the first, second, third, and fourth sets of semiconductors are directly connected,
   a first drain of the MOSFETs of the first set and a first drain of the MOSFETs of the second set are coupled to receive the first output,
   the gates of the MOSFETs of the first set and the fourth set are coupled to a first input port receiving a first signal defining a first portion of the given input,
   the gates of the MOSFETs of the second set and the third set are coupled to a second input port receiving a second signal defining a second portion of the given input, the first and second signals, when measured relative to each other at same time instants to determining the polarity of the given input,
   a first drain of the MOSFETs of the third set and a first drain of the MOSFETs of the fourth set are coupled to receive the second output, and
   a second drain of the MOSFETs of the first set, a second drain of the MOSFETs of the second set, a second drain of the MOSFETs of the third set, and a second drain of the MOSFETs of the fourth set are coupled to the common output port.

5. The sensor of claim 1, wherein the semiconductor rectifier includes at least four MOSFETs, each MOSFET having a respective source, drain, and gate,
   a first MOSFET of the at least four MOSFETs is coupled (i) at its drain to a first port of the given input and a drain of a second MOSFET of the at least four MOSFETs, (ii) at its gate to a second port of the given input, and (iii) at its source to the source of a third MOSFET of the at least four MOSFETs and the first and second conversion sensors,
   the second MOSFET of the at least four MOSFETs is coupled (i) at its drain to the first port of the given input and the drain of the first MOSFET, (iii) at its gate to a second port of the given input, and (iii) at its source to the source of a fourth MOSFET of the at least four MOSFETs and the first and second conversion sensors,
   the third MOSFET of the at least four MOSFETs is coupled (i) at its source to the source of the first MOSFET, and the first and second conversion sensors, (ii) at its drain to the second port of the given input, and (iii) at its gate to the first port if the given input, and
   the fourth MOSFET is coupled (i) at its drain to the second port of the given input and the drain of the third MOSFET, (ii) at its gate to the first port of the given input, and (iii) at its source to the source of the second MOSFET and the first and second conversion sensors.

6. The sensor of claim 1, wherein the semiconductor rectifier is configured to direct a signal of a correct polarity to the first conversion sensor and the second conversion sensor based on the polarity of the given input, and the semiconductor multiplexer, based on the polarity of the same given input, is configured to direct the first output or the second output to the common output port.

7. The sensor of claim 1, further comprising a programming module including three ports through which to program the first and second conversion sensors, wherein first and second programming module ports are coupled to the semiconductor rectifier to power the first and second conversion sensors during application of positive and negative polarity voltage levels, respectively, and wherein a third programming module port is coupled to the common output to program the first and second conversion sensors during application of the positive and negative polarity voltage levels, respectively, to the first and second conversion sensors.

8. The sensor of claim 1, wherein the first and second conversion sensors are configured to measure a rotation or linear position of a mechanical device being observed regardless of the polarity of the given input.

9. A method of sensing linear position or rotation, the method comprising:
producing a first output responsive to a given input at a first conversion sensor;
producing a second output responsive to the given input at a second conversion sensor, a sum of the first output and second outputs being constant regardless of whether the given input has positive or negative polarity;
powering, at a semiconductor rectifier, the first conversion sensor and the second conversion sensor with a given polarity regardless of whether the given input has a positive or negative polarity; and
directing, at a semiconductor multiplexer circuit, the first output to a common output port if the given input has a positive polarity and the second output to the common output port if the given input has a negative polarity.

10. The method of claim 9, wherein the first conversion sensor is a hall effect sensor and the second conversion sensor is a hall effect sensor.

11. The method of claim 9, further comprising:
directing, in a first channel of the semiconductor multiplexer, the first output to the common output port, the first channel including a first set of n-type MOSFET semiconductors connected in series and a second set of p-type MOSFET semiconductors connected in series, the first set and the second set connected in parallel; and
directing, in a second channel of the semiconductor multiplexer, the second output to the common output port, the second channel including a third set of n-type MOSFET semiconductors connected in series and a fourth set of p-type MOSFET semiconductors connected in series, the third set and the fourth set connected in parallel.

12. The method of claim 11, further comprising:
directly connecting respective sources of the MOSFETs within the respective first, second, third, and fourth sets of semiconductors;
directly connecting gates of MOSFETs within the respective first, second, third, and fourth sets of semiconductors;
coupling a first drain of the MOSFETs of the first set and a first drain of the MOSFETs of the second set to receive the first output,
coupling gates of the first set and the fourth set to a first input port receiving a first signal defining a first portion of the given input,
coupling gates of the second set and the third set to a second input port receiving a second signal defining a second portion of the given input, the first and second signals, when measured relative to each other at same time instants determine the polarity of the given input,
coupling a first drain of the MOSFETs of the third set and a first drain of the MOSFETs of the fourth set to receive the second output, and
coupling a second drain of the MOSFETs of the first set, a second drain of the MOSFETs of the second set, a second drain of the MOSFETs of the third set, a second drain of the MOSFETs of the fourth set to the common output port.

13. The method of claim 9, wherein the semiconductor rectifier includes at least four MOSFETs, each MOSFET having a respective source, drain, and gate, and further comprising:
coupling a first of the MOSFETs (i) at its drain to a first port of the given input and a drain of a second of the MOSFETs, (ii) at its gate a second port of the given input, and (iii) at its source to the source of a third of the MOSFETs and the first and second conversion sensors,
coupling the second of the MOSFETs (i) at its drain to the first port of the given input and the drain of the first of the MOSFETs, (ii) at its gate to a second port of the given input, and (ii) at its source to the source of a fourth of the MOSFETs and the first and second conversion sensors,
coupling the third of the MOSFETs (i) at its source to the source of the first of the MOSFETs, and the first and second conversion sensors, (ii) at its drain to the second port of the given input, and (iii) at its gate to the first port if the given input, and
coupling the fourth of the MOSFETs (i) at its drain to the second port of the given input and the drain of the third of the MOSFETs, (ii) at its gate the first port of the given input, and (iii) at its source to the source of the second of the MOSFETs and the first and second conversion sensors.

14. The method of claim 9, further comprising:
directing, at the semiconductor rectifier, a signal of a correct polarity to the first conversion sensor and the second conversion sensor based the polarity of the given input; and
directing, the semiconductor multiplexer, based on the polarity of the given input, first output or the second output to the common output port.

15. The method of claim 9, further comprising:
programming the first and second conversion sensors using a programming module having three ports through which to program the first and second conversion sensors by: coupling first and second programming module ports to the semiconductor rectifier to power the first and second conversion sensors during application of positive and negative polarity voltage levels, respectively, and coupling a third programming module port to the common output to program the first and second conversion sensors during application of the positive and negative polarity voltage levels, respectively, to the first and second conversion sensors.

16. The method of claim 9, further comprising sensing, at the first and second conversion sensors, a rotation or linear position of a mechanical device being observed regardless of the polarity of the given input.

17. An apparatus for a linear or rotation sensor, comprising:
means for producing a first output responsive to a given input;
means for producing a second output responsive to the given input, a sum of the first output and second output being constant regardless of whether the given input has a positive or negative polarity;
means for powering a first conversion sensor and a second conversion sensor with a given polarity regardless of whether the given input has a positive or negative polarity; and
means for directing the first output to a common output port if the given input has a positive polarity and directing the second output to the common output port if the given input has a negative polarity.

18. The means of claim 17, wherein the first conversion sensor is a hall effect sensor and the second conversion sensor is a hall effect sensor.

19. The means of claim 17, wherein the means for directing the first output or the second output to the common output port comprises a semiconductor multiplexer means comprising:
 first means for directing the first output to the common output port, the first means including a first set of n-type MOSFET semiconductors connected in series and a second set of p-type MOSFET semiconductors connected in series, the first set and the second set connected in parallel; and
 second means for directing the second output to the common output port, the second means including a third set of n-type MOSFET semiconductors connected in series and a fourth set of p-type MOSFET semiconductors connected in series, the third set and the fourth set connected in parallel.

20. The means of claim 19, wherein
 respective sources of the MOSFETs within the respective first, second, third, and fourth sets of semiconductors are directly connected, gates of MOSFETS within the respective the first, second, third, and fourth sets of semiconductors are directly connected,
 a first drain of the MOSFETs of the first set and a first drain of the MOSFETs of the second set are coupled to receive the first output,
 gates of the first set and the fourth set are coupled to a first input port receiving a first signal defining a first portion of the given input,
 gates of the second set and the third set are coupled to a second input port receiving a second signal defining a second portion of the given input, the first and second signals, when measured relative to each other at same time instants determine the polarity of the given input,
 a first drain of the MOSFETs of the third set and a first drain of the MOSFETs of the fourth set are coupled to receive the second output, and
 a second drain of the MOSFETs of the first set, a second drain of the MOSFETs of the second set, a second of the drains of the third set, a second of the drains of the fourth set are coupled to the common output port.

* * * * *